United States Patent
Bar-Gadda (10) Patent No.: US 9,985,299 B1
(45) Date of Patent: May 29, 2018

(54) SIMULTANEOUS GENERATION OF ELECTRICITY AND CHEMICALS USING A RENEWABLE PRIMARY ENERGY SOURCE

(71) Applicant: Ronny Bar-Gadda, Palo Alto, CA (US)

(72) Inventor: Ronny Bar-Gadda, Palo Alto, CA (US)

(73) Assignee: Ronny Bar-Gadda, Palo Alto, CA (US)

( * ) Notice: Subject to any disclaimer, the term of this patent is extended or adjusted under 35 U.S.C. 154(b) by 565 days.

(21) Appl. No.: 14/537,792

(22) Filed: Nov. 10, 2014

Related U.S. Application Data (60) Provisional application No. 62/061,578, filed on Oct. 8, 2014.

(51) Int. Cl.
| | | |
|---|---|---|
| *H01L 31/068* | (2012.01) | |
| *H01M 8/0202* | (2016.01) | |
| *H01G 9/20* | (2006.01) | |
| *H01L 31/00* | (2006.01) | |

(52) U.S. Cl.
CPC ............ *H01M 8/0202* (2013.01); *H01G 9/20* (2013.01); *H01L 31/00* (2013.01); *H01M 2250/402* (2013.01); *Y02E 10/566* (2013.01)

(58) Field of Classification Search
CPC . Y02E 10/566; H01M 2250/402; H01G 9/20; H01L 31/00
See application file for complete search history.

(56) References Cited

U.S. PATENT DOCUMENTS

| | | |
|---|---|---|
| 3,275,923 A | 9/1966 | Laing et al. |
| 3,302,095 A | 1/1967 | Bell et al. |
| 4,247,379 A | 1/1981 | Leach |
| 4,303,845 A | 12/1981 | Davis |
| 6,111,358 A | 8/2000 | Cardwell et al. |
| 8,816,192 B1 | 8/2014 | Walitzki |
| 2002/0157701 A1 | 10/2002 | Akamatsu |
| 2009/0108252 A1 | 4/2009 | Banerjee et al. |

OTHER PUBLICATIONS

Goodman, Philip et al., "Summary Report No. 1: Study materials for thermionic converters," Allied Research Associates, Inc., Office of Naval Research, Document No. ARA-1029, Dec. 31, 1961 (88 pgs).
International Search Report dated Dec. 18, 2015, in related Application No. PCT/US15/053819, filed Oct. 2, 2015 (2pgs).
Written Opinion dated Dec. 18, 2015, in related Application No. PCT/US15/053819, filed Oct. 2, 2015 (6pgs).

*Primary Examiner* — Lisa S Park
(74) *Attorney, Agent, or Firm* — North Weber & Baugh LLP (57) ABSTRACT

Presented are systems and methods to simultaneously produce and store energy in the form of chemical products such as hydrogen and other chemical products, thereby, reducing or eliminating the need to store energy in lithium-ion batteries. In various embodiments this is accomplished by converting energy from a renewable energy source to generate and accelerate an electron beam so as to generate electromagnetic radiation at frequencies equal to absorption frequencies of chemical reactants in order to produce the desired chemical products.

8 Claims, 8 Drawing Sheets

SIMULTANEOUS GENERATION OF ELECTRICITY AND CHEMICALS USING A RENEWABLE PRIMARY ENERGY SOURCE

CROSS REFERENCE TO RELATED PATENT APPLICATIONS

The present application claims priority to U.S. Provisional Patent Application No. 62/061,578, titled "The Simultaneous Generation of Electricity and Chemicals using a Renewable Primary Energy Source," filed Oct. 8, 2014 by Ronny Bar-Gadda, which application is hereby incorporated herein by reference in its entirety.

BACKGROUND

A. Technical Field

The present invention relates to the generation and storing of electricity and chemical products and, more particularly, to systems, devices, and methods of concurrently generating power and electromagnetic radiation using renewable sources while producing chemical reactants.

B. Background of the Invention

Existing methods of generating electrical power through combustion of conventional fossil fuel energy sources are typically based on the utilization of a working fluid such as a gas or boiler-generated stream in a thermodynamic cycle in order to generate a motive force for rotating the shaft of a turbine, thereby, transforming chemical energy into an electromotive force that generates electrical energy. These methods are inherently limited by the maximum achievable Carnot cycle efficiency. In addition, the change of phase of material, such as the transformation of the water to steam requires large quantities of energy, most of which is lost in the form of heat due to condensation after exiting the turbine.

Alternative technologies that generate electrical power in the form of current and voltage from non-carbon-based sources suffer similarly from respective theoretical maximum efficiencies, for example, 59.3% for wind technology.

In contrast, solar cell technology using the photovoltaic effect undergoes an isothermal process that is not subject to power cycle analysis and the limitations of the Carnot cycle efficiency. Energy from the sun in the form of photons carrying energy or electromagnetic radiation can be harnessed directly to induce an electromotive force on free electrons to generate electrical power. Unfortunately, solar cells have inherent losses, such as $I^2R$ losses, and the energy produced in the cell still needs to be stored before it can be transported and used. Until now, this made solar energy unattractive for applications such as the industrial-scale production of chemicals in capital-intensive facilities. What is needed are environmentally friendly systems and processes that efficiently produce chemicals while overcoming the above-described limitations.

SUMMARY OF THE INVENTION

Various embodiments of the invention simultaneously produce and store energy in the form of chemical products, thereby, reducing or eliminating the need to store energy in lithium-ion batteries. Various embodiments continuously create power from small units of energy derived from a renewable primary source by converting photons to electrons, storing, and transferring energy at very high rates. The electric field intensity within a p-n junction of a solar cell is transferred to an inter-electrode spacing that does not have the restrictions of the solar cell, such as space charge resistance and ohmic losses. Electrons are accelerated to selectively produce electricity and electromagnetic radiation to initiate chemical reactions at specific frequencies that promote a particular chemistry. Water, nitrogen, and noble gases are potential byproducts of a hydrogen process for producing power. Additionally, the electromagnetic radiation may be used to transmit and receive communications signals.

In certain embodiments, one or more electron beams are produced using an electron source, such as a cathode or gas ionization. The electrons are accelerated to a high velocity using a high voltage source to produce large amounts of power. In some embodiments, the beam is manipulated in the transverse or cyclonic direction to generate electromagnetic radiation. The radiation is tuned to various frequencies via resonating cavities, magnetic assemblies, or beam manipulation in order to generate frequencies chosen to interact with a reactant molecular structure so as to effect change in its chemical composition and produce useful chemicals and fuels, while simultaneously generating electricity.

A cathode or gas ionization produces relatively higher current densities than existing processes (e.g., a semiconductor solar cell) to "amplify" the power emanating from a solar panel and simultaneously generate high currents and voltage. The generated electricity may be continuous direct current, pulsed direct current, or alternating current depending on system configuration. Extremely high frequencies are achieved via the principle of radiation generation when accelerating charge in the electron beam. When the beam is exposed to a longitudinal magnetic field in a specially designed electron cyclotron resonance chamber or drift tube, specific frequencies are produced and used to effect desired chemical reactions, such as the cracking of water vapor into hydrogen and oxygen. One example of such a device is a gyrotron and its variants, including TWT gyrotron, gyroklystron, traveling wave tube, etc.

The applied magnetic field may be periodic and arranged in a direction perpendicular to the beam propagation direction so as to generate a transverse radiation field, similar to those in free electron lasers. The amount of electromagnetic production or increase in power production may be controlled via a second electromagnetic source, e.g. the sun, or be artificially created external to the electron beam drift tube. The electromagnetic field thus can interact with the electron beam to exchange energy as a result of acceleration or retardation of electrons. The kinetic energy of the electrons is converted into electromagnetic energy, and vice versa.

In some embodiments, electromagnetic radiation interacts with a plasma electron beam to generate frequencies favorable to the desired chemistry.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that this is not intended to limit the scope of the invention to these particular embodiments.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize that additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily referring to the same embodiment.

Furthermore, connections between components or between method steps in the figures are not restricted to connections that are affected directly. Instead, connections illustrated in the figures between components or method steps may be modified or otherwise changed through the addition thereto of intermediary components or method steps, without departing from the teachings of the present invention.

Figure 1:
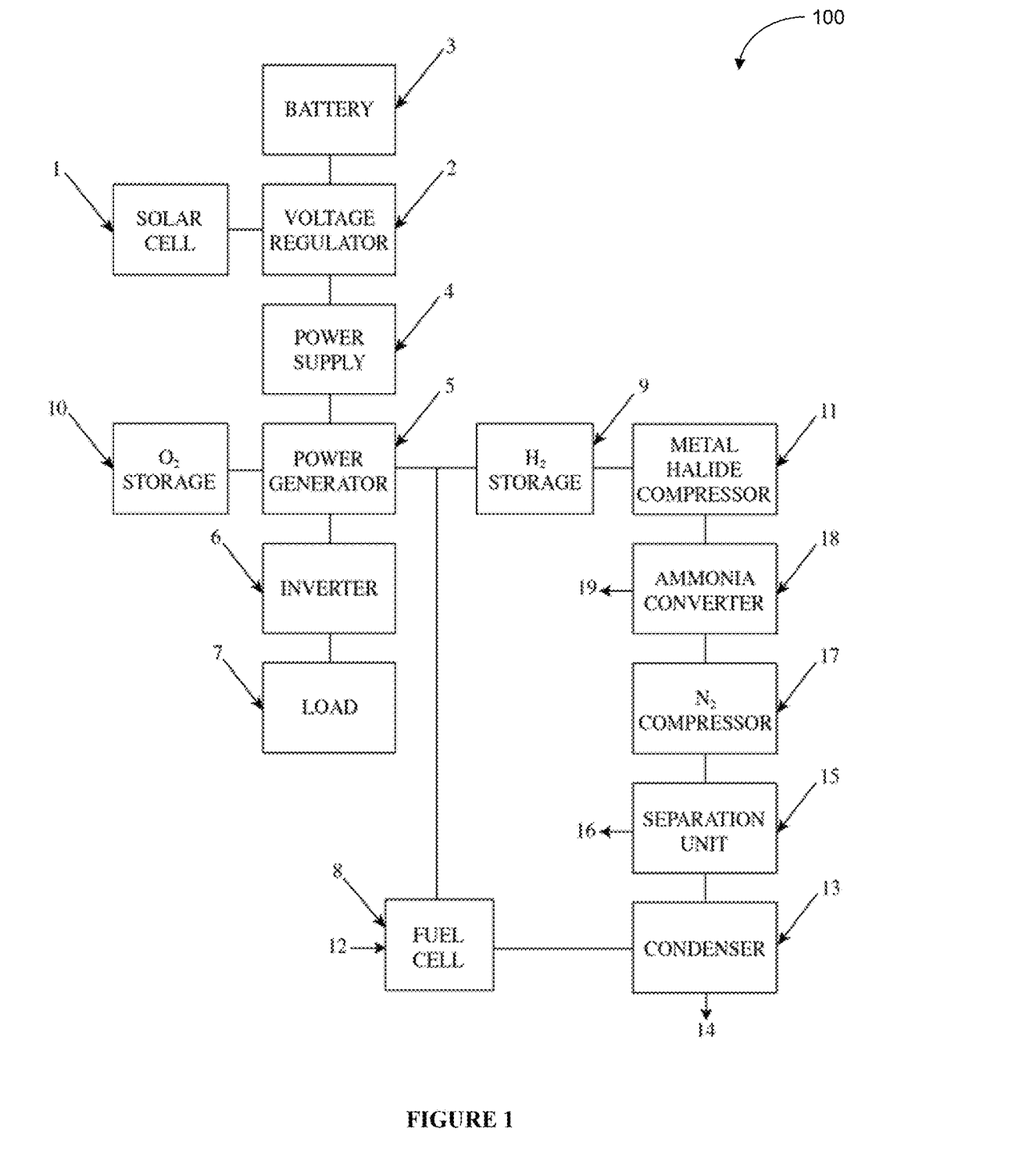
FIG. 1 is a general illustration of a system to generate energy from a renewable energy source according to various embodiments of the invention.

FIG. 1 is a general illustration of a system to generate energy from a renewable energy source according to various embodiments of the invention. System 100 comprises solar cell 1, voltage regulator 2, battery 3, power supply 4, power generator 5, inverter 6, load 7, fuel cell 8, hydrogen storage 9, oxygen storage 10, metal halide compressor 11, condenser 13, separation unit 15, nitrogen compressor 17, and ammonia converter 18. Solar cell 1 typically comprises a plurality of a solar panels that convert photons from sunlight into voltage. In one embodiment, solar cell 1 is implemented as a high voltage solar panel that outputs a sufficiently high voltage to replace power supply 4.

Solar cell 1 is coupled to voltage regulator 2 that in operation regulates the output voltage of solar cell 1 to smooth out voltage variations due to varying insolation caused by natural variations in the sun's position relative to solar cell 1 and meteorological conditions, such as clouds causing a reduction in the intensity of sunlight incident on the surface of solar cell 1. Battery 3 provides energy, especially, it instances where the sun's insolation is reduced to a level that causes the power output of power generator 5 to fall below a minimum value. Battery 3 may advantageously be operated at nighttime to enable continuous power delivery by system 100 to load 7, which is an electric motor or any other electric device. Likewise, metal hydride compressor 11 may be used in conjunction with fuel cell 8 to generate electricity during hours when the solar insolation falls below a critical level of performance in which the solar panel delivers power at a rate that cannot meet demand. Power supply 4 may provide direct or alternating current to power generator 5. In one embodiment, power generator 5 is designed to generate high frequency electromagnetic radiation that may be used, for example, to generate hydrogen from water vapor.

The electromagnetic radiation is generated by resonant or non-resonant structures designed to interact with an electron beam to generate one or more high frequencies. Ideally, the frequencies fall in a range of absorption frequencies useful for creating desired chemical compounds. The operation of sections of system 100 under vacuum conditions allows for the generation of the water vapor taking advantage of the depressed boiling point at sub-atmospheric pressures. In one embodiment, hydrogen is generated from water vapor using electromagnetic radiation by generating frequencies equal to the optimum frequency for absorption of energy in water molecules.

Water vapor may be produced by any method known in the art, including evaporation by solar heating or electrical heating, e.g., using electrical energy provided by solar cell 1. Water from any source, including waste water and salt water, may be dissociated into its elements, hydrogen and oxygen, and burned to form purified water. The resulting combustion heat may be used to produce electricity via conventional turbine technology. The so generated energy can then power, for example, water pumps that distribute the generated water.

In example in FIG. 1, oxygen generated in power generator 5 is delivered to oxygen storage unit 10, while generated hydrogen is delivered to storage unit 9. Fuel cell 8 generates electricity for night time operation of system 100. Fuel cell 8 derives its hydrogen fuel from hydrogen storage unit 9 and air or oxygen from oxygen storage 10. A compressor (not shown) may be advantageously placed between hydrogen storage unit 9 and fuel cell 8 to increase the pressure of the hydrogen entering fuel cell 8. Since solar power is direct current in nature, inverter 6 may be used to generate an alternating current depending on the requirements of power generator 5, whose components and function are described further below with respect to FIG. 2, but may not be necessary in DC applications of power generator 5 and in single or three-phase power generation application, as described further below.

In one embodiment, system 100 in FIG. 1 is designed to produce ammonia in addition to producing hydrogen and oxygen. If carbon dioxide is used as a reactant instead of nitrogen, other chemicals such as methane or methanol may be produced. Since ammonia is thermodynamically favored at high pressure and low temperatures, as can be derived from its stoichiometry, a compressor, e.g., metal hydride compressor 11, can be used to increase the pressure to meet desired reaction conditions. Similarly, nitrogen compressor 17 is utilized in order to raise the nitrogen pressure. In one embodiment, hydrogen from metal hydride compressor 11 and nitrogen from 17 are combined in ammonia converter 18 in order to produce ammonia products 19. Unlike existing methods that generate pure nitrogen from the air using conventional separation methods such as cryogenic or membrane separation, the concomitant production of noble gases and pure water along with nitrogen using system 100 optimizes the economics and efficiency of the overall production of ammonia.

Condenser 13 located at the exit of fuel cell 8 recovers the water generated as pure condensed water 14 byproduct of the electricity generation process. Condensed water 14 may be gathered and sold or serve other process functions, such as cooling. The remaining residual gases flow to separation unit 15 where noble gases are removed, shown as exit stream 16 in FIG. 1. Their constituents can be removed separately through many different methods. For example, separation unit 15 may be an adsorption column, whereby separation of the various gaseous components are eluded according to their adsorption coefficient on the surface of the material used for the separation. These materials are commonly found in adsorption columns in gas chromatographic processes. The remaining constituent, nitrogen, enters nitrogen compressor 17 for use in the ammonia synthesis process.

Since air contains both nitrogen and noble gases (e.g., helium, argon, xenon, krypton) as well as oxygen, these materials as well as the product of the fuel cell process, i.e., water, can be recovered as byproducts. In one embodiment, the oxidizer for fuel cell 8 may operate with air 12 instead of pure oxygen from oxygen storage 10, and noble gases are recovered. Nitrogen may also be recovered from exit stream 16 since its separation properties are sufficiently distinctive from that of oxygen. The two key products; namely, hydrogen and nitrogen, may be combined in the correct ratio to produce ammonia. Other commercial chemicals such as methanol, ethanol, hydrocarbons, ethers, longer chain alcohols, aldehydes, ketones, phenols, heterocyclic compounds, etc. may be produced from $CO_2$, which may be obtained from a variety of sources.

Figure 2:
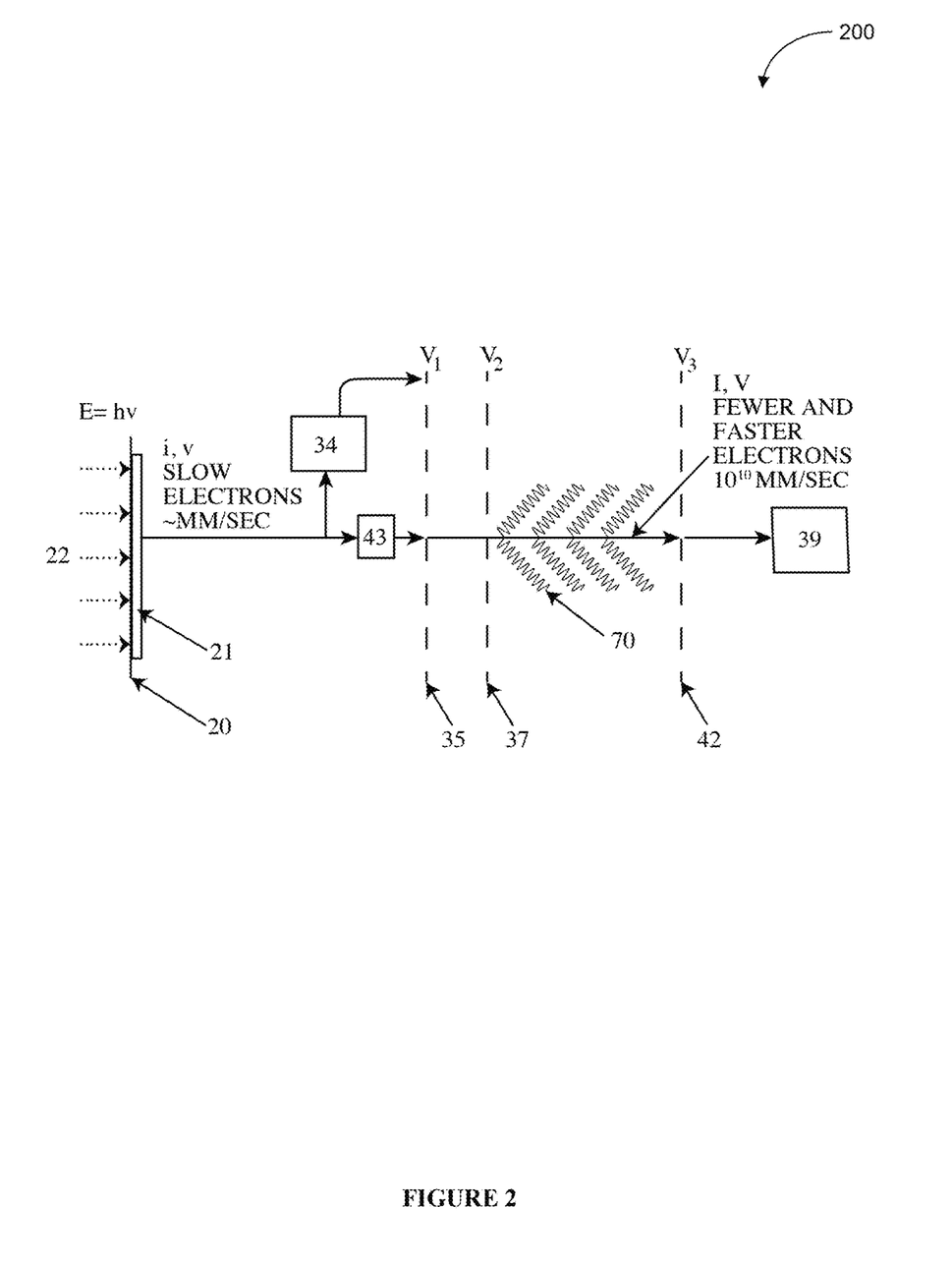
FIG. 2 is an exemplary schematic of a power generator to generate energy from a renewable energy source according to various embodiments of the invention.

FIG. 2 is an exemplary schematic of a power generator to generate energy from a renewable energy source according to various embodiments of the invention. Power generator 200 comprises solar cell 20 comprising p-n junction 21, transformer 34, heater 43, emitter 35, grid 37, collector 42, and power conditioner 39. In operation, solar cell 20 receives electromagnetic radiation in the form of sun light 22 that is captured, temporarily stored in p-n junction 21, and output to both transformer 34 and heater 43. Heater 43 performs thermionic generation of electrons from emitter 35, while transformer 34 raises the voltage on emitter 35 to higher levels. Electrons emitted from emitter 35 form a coherent train of electrons or an electron beam that is directed through grid 37.

In one embodiment, the electron beam is employed to generate pulsed or alternating current. The electrons are subsequently deposited on one or more collector electrodes 42 in order to capture the energy in the electron beam. In one embodiment, multiple collector electrodes 42 within varying bias voltages may be positioned in such a manner as to capture electrons having different levels of the kinetic energy. The collected electrons generate a current that can be filtered and otherwise processed to drive various types of loads (not shown).

The method of accelerating electrons in example in FIG. 2 may be used to generate coherent electromagnetic radiation 70 using various structures, such as resonating cavities, magnets or coils, dielectric liners, etc. In embodiments, coherent electromagnetic radiation 70 is tuned to a specific frequency or band of frequencies that is used to perform specific tasks, as will be discussed with respect to FIG. 4 through FIG. 7 below.

Figure 3:
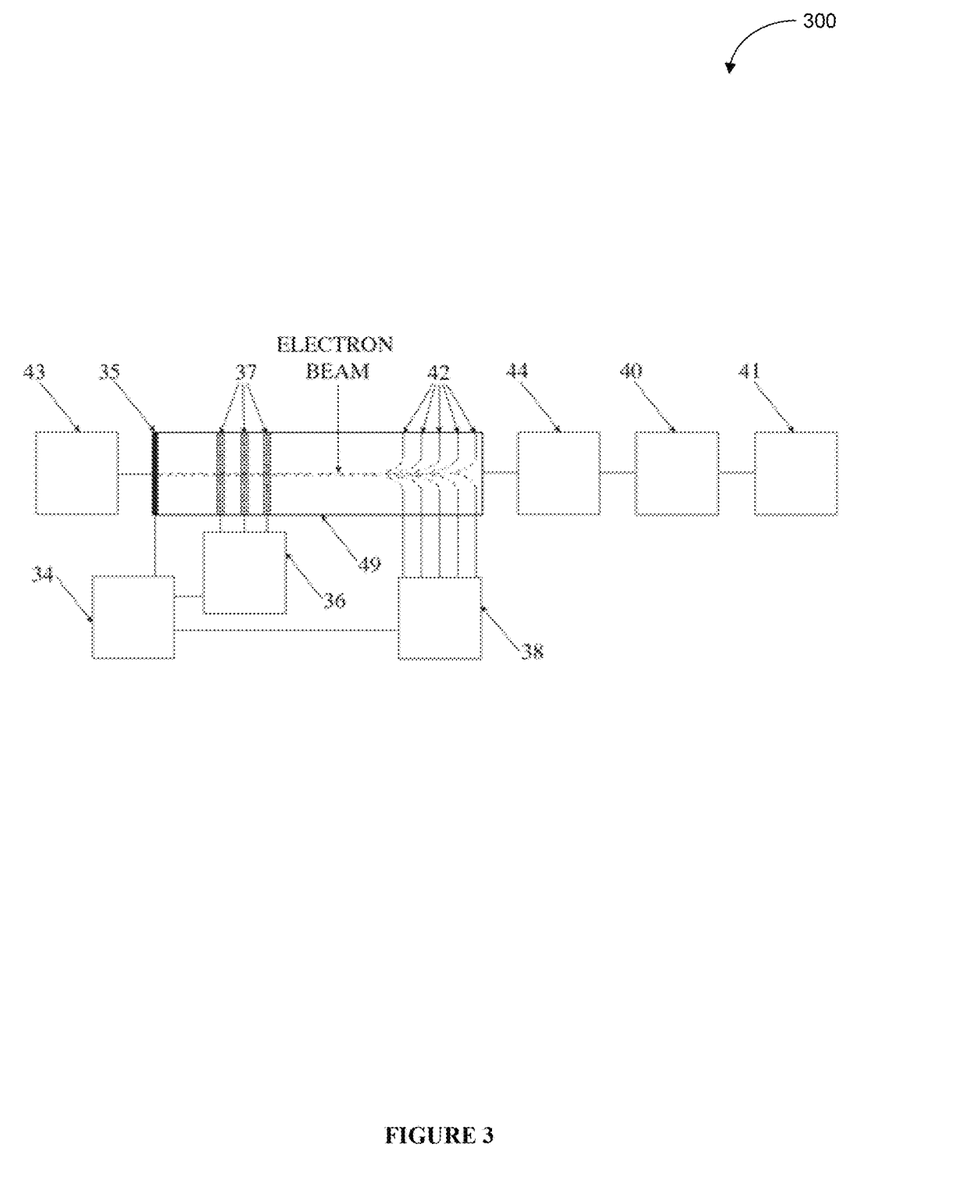
FIG. 3 is an exemplary a power generator capable of generating phased electrical power according to various embodiments of the invention.

FIG. 3 is an exemplary a power generator capable of generating phased electrical power according to various embodiments of the invention. Power generator 300 comprises power supply 34, emitter 35, grid power supply 36, grid 37, collector power supply 38, collector electrodes 42, heater power supply 43, inverter 39, transformer 40, and load 41. Although power generator 300 may produce electromagnetic radiation, it is not optimized to produce a coherent electron beam at a specific or band of frequencies. Grid 37 is a fine mesh to allow the electron beam to pass through or be stopped according to the desired outcome. The mesh is used to allow electrical continuity and a path for the applied charge.

In operation, cathode power supply 34 provides power for emitter 35. Grid power supply 36 controls the space charge in drift tube 49 by superimposing a forcing function, e.g., a pulsed or sinusoidal waveform, on the electron beam in order to simulate an alternating current. Using three grids 37 permits three-phase electrical power generation in that each grid has a sinusoidal forcing function that is 120 degrees out of phase with the other two sinusoids. The net result of this operation is a three-phase alternating beam current. The advantage of this embodiment is that inverter 39 is not needed, such that (e.g., after a filtering step) the current can go directly to transformer 40 and to load 41.

In one mode of operation, the electron beam is pulsed. This may easily be accomplished by turning on and off the current and voltage applied to grid 37 by grid power supply 36 in order for the electron beam to mimic the properties of grid 37. Optional heater power supply 43 is coupled to emitter 35 (e.g., field emission emitter) to support the creation of thermionic electrons. As shown in example in FIG. 3, collector power supply 38 is referenced to cathode power supply 34. The potential of collector electrodes 42 are matched to the potential of the electrons in the electron beam in order to recover the energy of the beam.

In instances where grid 37 is not used as a means to convert a direct current electron beam into alternating current, inverter 39 may be used to provide that functionality. In addition, inverter 39 may comprise power conditioning circuitry to process the power output from collector electrodes 42. For example, inverter 39 may be designed to eliminate noise and spurious signals, such as unwanted spikes. Transformer 40 typically converts a low current at a high voltage present at the output of inverter 39 into a relatively lower voltage but higher current, prior to delivering power to load 41.

While FIG. 3 depicts an embodiment comprising three grids 37 designed to generate three-phase power, it is understood that other phases, e.g., single-phase power may equally be generated by power generator 300 by utilizing a single grid 37. One of ordinary skill in the art will appreciate that also different waveforms may be generated using various methods known in the art, including amplitude modulation, pulsed code modulation, pulsed duration modulation, pulsed position modulation, pulsed amplitude modulation, and frequency modulation.

Figure 4:
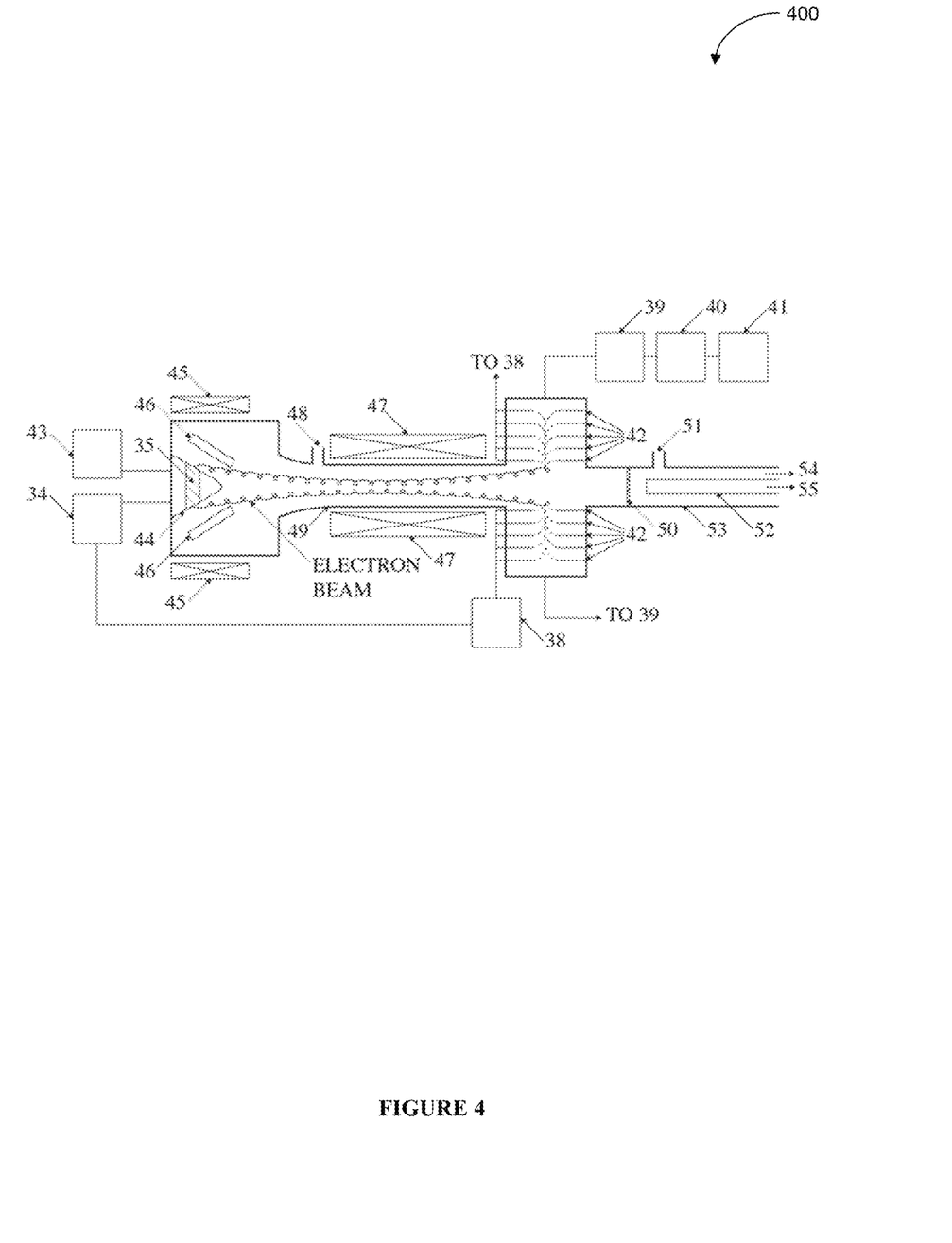
FIG. 4 illustrates a power generator capable of producing electromagnetic radiation at a specific microwave frequency according to various embodiments of the invention.

FIG. 4 illustrates a power generator capable of producing electromagnetic radiation at a specific microwave frequency, according to various embodiments of the invention. Power generator 400 comprises emitter power supply 34, emitter or cathode 35, collector power supply 38, inverter 39, transformer 40, and load 41, collector electrodes 42, heater power supply 43, magnetron injection gun 44, magnets 45, anode 46, magnetic assembly 47, port 48, 51, drift tube 49, window 50, inner tube 52, outer tube 53, and exit ports 54 and 55, respectively. For clarity, components similar to those shown in FIG. 3 are labeled in the same manner.

As shown in FIG. 4, electromagnetic reactor section of power generator 400 consists of two coaxial concentric tubes, inner tube 52 and outer tube 53. Inner tube 52 typically comprises a porous wall or membrane that allows for selective diffusion of products generated in inner tube 52 to exit from outer tube 53. Outer tube 53 forms a non-porous walls of the reactor. In one embodiment, a difference in pressure between inner tube 52 and outer tube 53 causes selective diffusion of one component so that outer tube 53 is enriched in one component over another component. Conversely, reactants may enter outer tube 53 and exit after passing through the membrane of inner tube 52.

In order to maintain high voltage on emitter 35, power supply 34 may be employed. Power supply 34 derives its power from a renewable energy resource, such as the solar panel assembly mentioned previously. In one embodiment, a to-be-amplified signal from an electromagnetic source (e.g., IMPATT diode, RF, Microwave, sunlight, etc.) is provided through port 48. It is noted that port 48 may be used to extract energy as well as add energy to an existing electron beam.

In one embodiment, magnetron injection gun 44 is energized by supply 43 to generate a "hollow" electron beam via emitter 35. Anode 46 is positioned in a manner such as to cause the electron beam to initiate a rotational motion, while magnets 45 are strategically placed to aid in compressing the beam and directing it into drift tube 49. As the beam enters the drift tube 49, magnet 47 promotes the cyclonic and rotational movement of electrons in the beam and cause the electron beam to generate radiation at high frequency. The energy of the electron beam is captured by collector electrodes 42, which are powered by supply 38 and referenced to cathode power supply 34. The current then flows through power conditioner and inverter 39. As with embodiments related to FIG. 3, the beam may be modulated such as to establish an alternating current, thus, eliminating the need for inversion. The power conditioner may also filter out extraneous noise and signals in order to ensure a clean power signal entering transformer 40 and/or load 41.

It is known that some reactant molecules, such as water, have pronounced absorption frequencies that lie in the infrared, visible, and ultraviolet regions of the electromagnetic spectrum. Therefore, in one embodiment, power generator 400 is designed to generate specific frequencies, allow the electromagnetic portion of the beam to travel through window 50, and facilitate energy coupling to chemicals in the reactor section of power generator 400 in order to perform desired chemical reactions. In one embodiment, the frequencies generated in drift tube 49 correspond to absorption frequencies of reactant molecules entering reactor 53 through port 51.

Once the electromagnetic radiation imposed on the molecules is sufficiently strong to break the valence bonds between atoms, the reactant molecules dissociate into chemical products. For example, if the generated frequencies correspond to frequencies of maximum absorption for water vapor in a region of interest, then dissociation takes place once sufficient vibrational energy is generated to break the hydroxyl bonds to create hydrogen and oxygen. Gaseous products are separated through the membrane of inner tube 52, which may be designed to be selective to only one of the gases. The separated gases leave the reactor through exit ports 54 and 55, respectively.

In the region where water vapor dissociation is optimum (e.g. ultraviolet, microwave, and infrared regions of the electromagnetic spectrum), the combination of inner and outer tubes 52, 53 may be considered a coaxial waveguide for electromagnetic waves generated in drift tube 49. The waveguide structure enables efficient decomposition of water vapor by dissociating water molecules entering outer tube 53. Since hydrogen possesses a higher molecular velocity than oxygen, it diffuses through the membrane of inner tube 52 to accumulate at high concentration in inner tube 52 from which it flows to exit port 55. The membrane may have a non-permeable coating (e.g., palladium, copper-palladium, silver-palladium, etc.) and be porous or selective to hydrogen so that relatively little or no oxygen molecules tend to diffuse from outer tube 53 to exit port 55. Conversely, water molecules may enter through port 51 and exit through port 55 instead of port 54 via an opening in the membrane of inner tube 52. One skilled in the art will appreciate that other classes of zeolites and activated carbons may be used.

Figure 5:
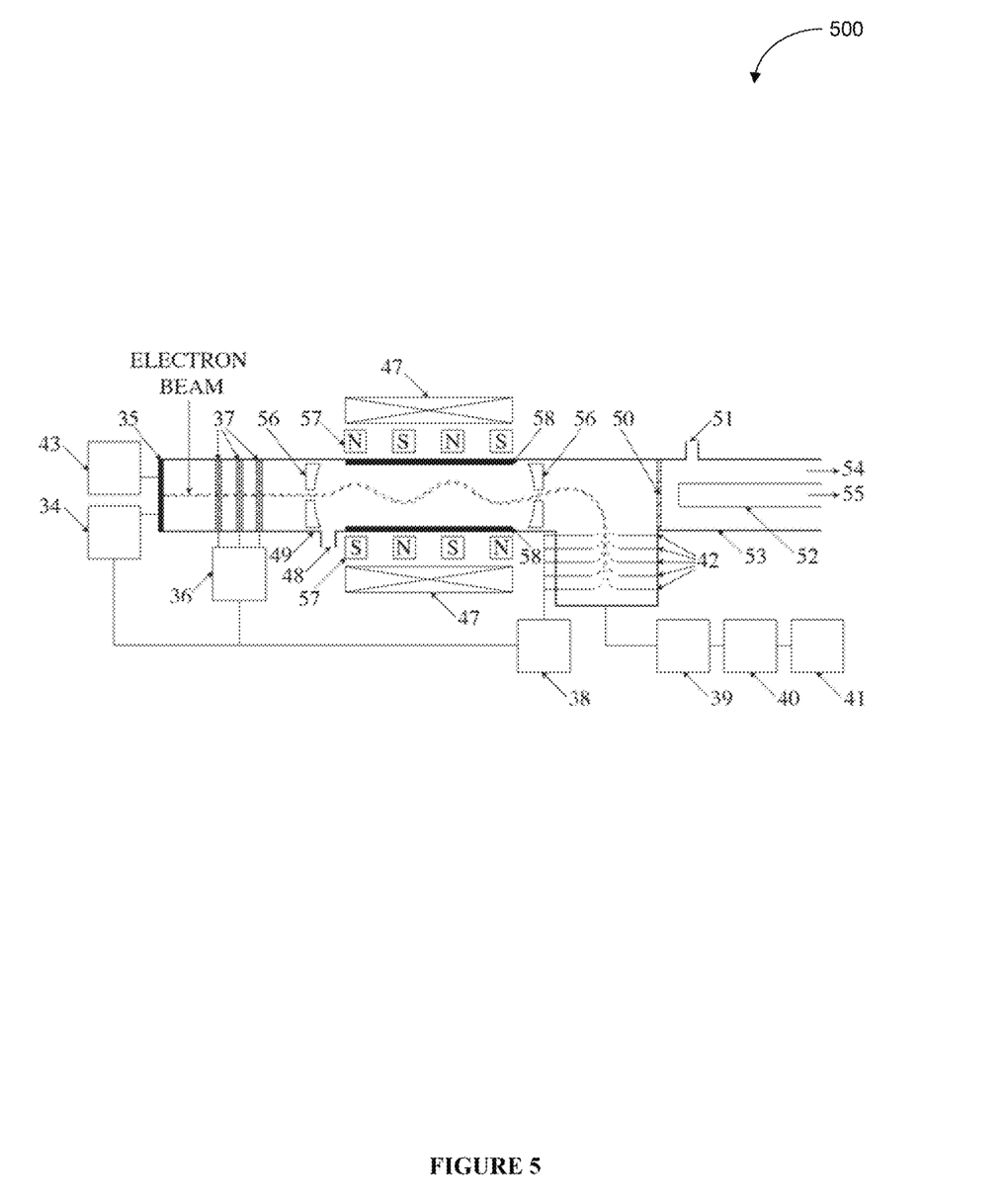
FIG. 5 illustrates a power generator capable of producing high frequency electromagnetic radiation via transverse motion of an electron beam, according to various embodiments of the invention.

FIG. 5 illustrates a power generator capable of producing high frequency electromagnetic radiation via transverse motion of an electron beam, according to various embodiments of the invention. Power generator 500 comprises emitter power supply 34, emitter or cathode 35, collector power supply 38, inverter 39, transformer 40, and load 41, collector electrodes 42, heater power supply 43, magnet 47, port 48, 51, drift tube 49, window 50, inner tube 52, outer tube 53, exit port 54-55, mirror 56, alternating magnetic assembly 57, and dielectric liner 58.

In example in FIG. 5, alternating magnetic assembly 57 is disposed between drift tube 49 and magnet 47. In operation, alternating magnetic assembly 57 maximizes a transvers motion of electrons in the electron beam. Mirror 56 aids in the generation of a coherent electromagnetic radiation that is used to produce a resonance effect within drift tube 49. Optional grid 37 may be used to operate power generator 500 in a way produce alternating current mentioned previously.

In one embodiment, alternating magnetic assembly 57 is replaced with a traveling wave guide structure in which a traveling wave is generated along a coil (not shown). The traveling wave enters drift tube 49 through port 48 and carries a high frequency wave. Under proper conditions, energy is exchanged between the electron beam and the traveling wave in order to amplify the wave or increase the energy of the electron beam. Magnetic assembly 47 may create a longitudinal magnetic field that compresses the electron. Magnetic assembly 47 may also create a cyclonic motion within the electron beam. The rotational component of the electrons generates a radiation field that interacts with the traveling wave of the coil.

In one embodiment, alternating magnetic assembly 57 and magnet 47 are replaced with a resonator structure to generate high frequency waves along which power can be extracted from an electron beam comprising bunched or bunching electrons. This embodiment may be used to amplify the resonant frequency in drift tube 49 to generate frequencies that otherwise are difficult to generate. For example, port 48 may receive electromagnetic waves having at certain frequencies. As the wave enters drift tube 49, under proper conditions, amplification of the electromagnetic waves occurs when energy is extracted from the electron beam. Part or all of the remaining energy of the electron beam is captured through collector electrodes 42 and processed as described elsewhere with respect to other embodiments. Port 48 may also be used to generate alternating current by injecting a wave having a frequency of, for example, multiples of 60 Hz. Power generator 500 may be designed to generate frequencies in any of the sub-millimeter, millimeter, infrared, visible, and ultraviolet regions of the electromagnetic spectrum to facilitate absorption by reactant molecules with corresponding absorption frequencies.

For example, at 22.235 GHz, a water molecule will absorb energy at the $5_{-1}$-$6_{-5}$ transition. In addition, water absorbs greater amounts of energy in the sub millimeter region. Absorption peaks at 183.31 GHz ($\lambda$=1.635 mm), 321.225 GHz ($\lambda$=0.933 mm), 325.152 GHz ($\lambda$=0.922 mm), 380.197 GHz ($\lambda$=0.7885 mm) are just a few of the absorption frequencies for water vapor. There are numerous such frequencies in the sub-millimeter and far infrared region, including 448.001 GHz ($\lambda$=0.6696 mm), 556.936 GHz ($\lambda$=0.5386 mm), 620.700 GHz ($\lambda$=0.4833 mm), 752.033 ($\lambda$=0.3989 mm), 916.171 GHz ($\lambda$=0.3274 mm), 970.315 GHz ($\lambda$=0.3091 mm), 987.926 GHz ($\lambda$=0.3036 mm), 1.0973 THz ($\lambda$=0.2733 mm), 1.11342 THz ($\lambda$=0.2694 mm), 1.16291 THz ($\lambda$=0.2579 mm), 1.20763 THz ($\lambda$=0.2484 mm), 1.22878 THz ($\lambda$=0.2441 mm), 1.41061 THz ($\lambda$=0.2126 mm), 1.60221 THz ($\lambda$=0.1872 mm), 1.66100 THz ($\lambda$=0.1806 mm), 1.66990 THz ($\lambda$=0.1796 mm), 1.71676 THz ($\lambda$=0.1747 mm), 1.79478 THz ($\lambda$=0.1671 mm), 1.79715 THz ($\lambda$=0.1669 mm), 1.86774 THz ($\lambda$=0.1606 mm), and 1.91935 THz ($\lambda$=0.1563 mm).

In the infrared range of 4 to 13 microns, there are a number of absorption frequencies in which the absorption coefficient is high enough so that the electromagnetic radiation couples well to the water vapor molecule. In this range, they are: 44.9 THz ($\lambda$=6.68 µm), 45.2 THz ($\lambda$=6.64 µm), 48.0 THz ($\lambda$=6.26 µm), 53.2 THz ($\lambda$=5.64 µm), 53.8 THz ($\lambda$=5.58 µm), 55.3 THz ($\lambda$=5.52 µm).

Throughout the spectrum there are special frequencies where the water vapor molecule favors maximum energy absorption. For example, 94.5 THz ($\lambda$=3.17 µm), 110 THz ($\lambda$=2.73 µm), 113 THz ($\lambda$=2.66 µm), 160 THz ($\lambda$=1.88 µm), 206 THz ($\lambda$=1.45 µm), 218 THz ($\lambda$=1.38 µm), 264 THz ($\lambda$=1.13 µm), 318 THz ($\lambda$=0.94 µm), 331 THz ($\lambda$=0.906 µm), 365 THz ($\lambda$=0.822 µm), 377 THz ($\lambda$=0.796 µm), 415 THz ($\lambda$=0.723 µm), 430 THz ($\lambda$=0.698 µm), 460 THz ($\lambda$=0.652 µm), 475 THz ($\lambda$=0.632 µm), 505 THz ($\lambda$=0.594 µm), 507 THz ($\lambda$=0.592 µm), 525 THz ($\lambda$=0.572 µm), 1.82 PHz ($\lambda$=0.1650 µm), and 2.42 PHz ($\lambda$=0.1240 µm).

Figure 6:
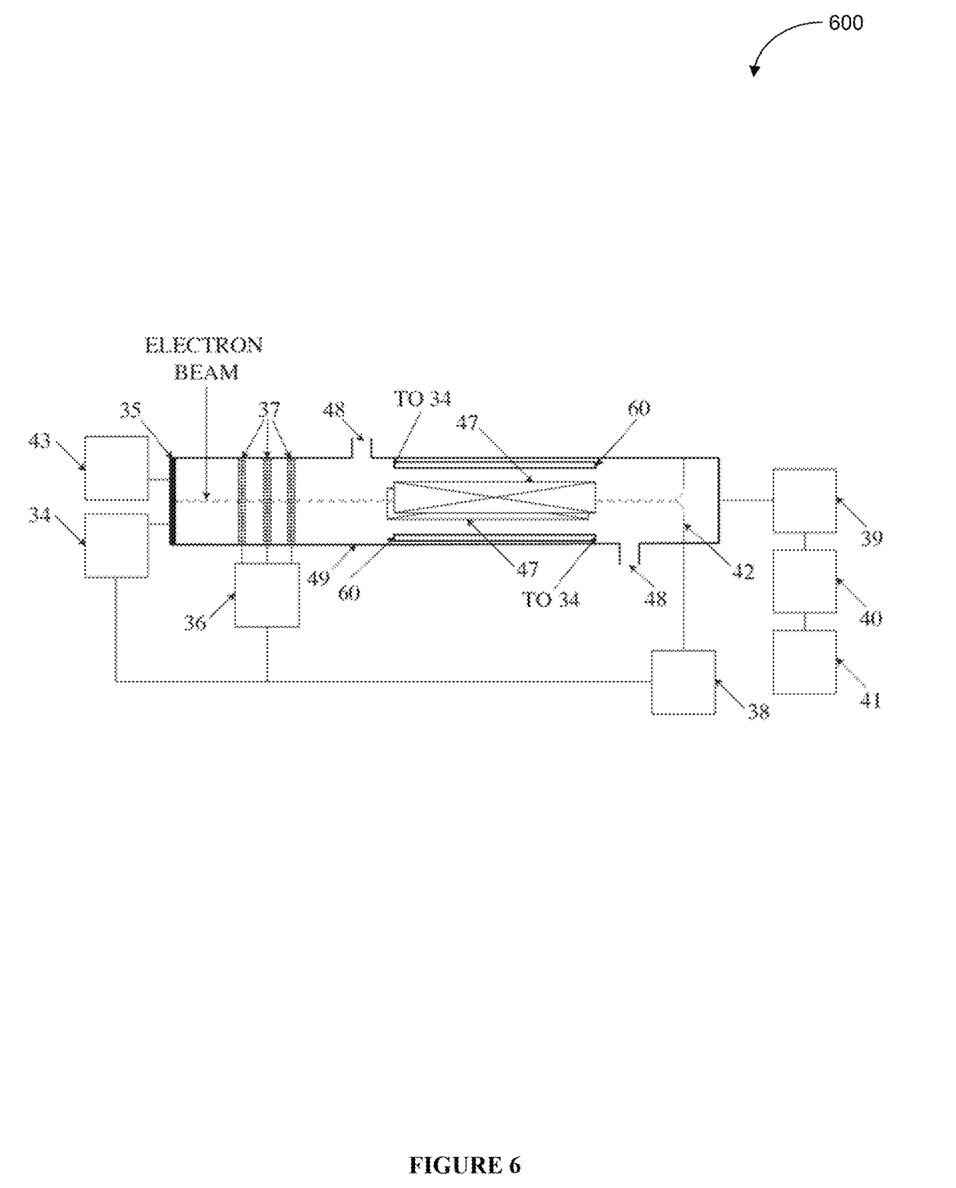
FIG. 6 illustrates a power generator that uses a selection of a narrow range of electron velocities in an electron beam to reduce the number of collector electrodes and accompanying power supply.

FIG. 6 illustrates a power generator that uses a selection of a narrow range of electron velocities in an electron beam to reduce the number of collector electrodes and accompanying power supply. Components similar to those shown in FIG. 5 are labeled in the same manner. Power generator 600 comprises parallel electrostatic deflection plates 60 and magnets 47 arranged in a perpendicular fashion within drift tube 49, as depicted in FIG. 6. The electrostatic field residing on electrostatic deflection plates 60 may be provided by cathode power supply 34. Deflection plates 60 generate an electrostatic field that is mutually perpendicular to the magnetic field generated by magnets 47. Both fields are positioned orthogonal manner to the path of the electron beam, resulting in a certain number of electrons having a specific velocity and trajectory to travel directly to collector electrode 42 in a straight line undeflected from their original path. Applying a perpendicular magnetic field relative to the velocity of the electron beam without electrostatic deflection plates parallel to the electron beam, allows for targeted separation electrons of different velocities, and hence different potentials. This, in effect, allows for selective filtering of beam electrons having a specific velocity.

In one embodiment, additional collector electrodes having varying potential are placed on either side of a main collector electrode 42 for the purpose of accepting a matching electron potential at each respective collecting electrode. As a result, the number of electrons captured by the multiple collector electrodes is increased with the electron distribution being centered about the main collector electrode 42. Additionally, it is possible to generate a pseudo-sinusoidal electron beam in order to stimulate an alternating current.

In one embodiment, an electron entering the magnetic field experiences a downward force due to the combination of the forward component of their velocity and the transverse magnetic field. This force is directed downward if the initial electron velocity is greater than that at which the electric and magnetic forces balance. The result of the downward component of velocity and the transverse magnetic field produces a backward component of force that may be sufficient to cause the electron to turn a loop. If the initial velocity is less than that for which the electric and magnetic forces are in balance, the electron will experience an upward force, which, in turn, gives a forward acceleration. The result is an undulating forward progression. This undulating forward progression resembles a sinusoid and can be used to convert the beam to an alternating current having a period that is a function of the magnetic field strength. Thus, an electron beam can directly generate an alternating current.

Figure 7:
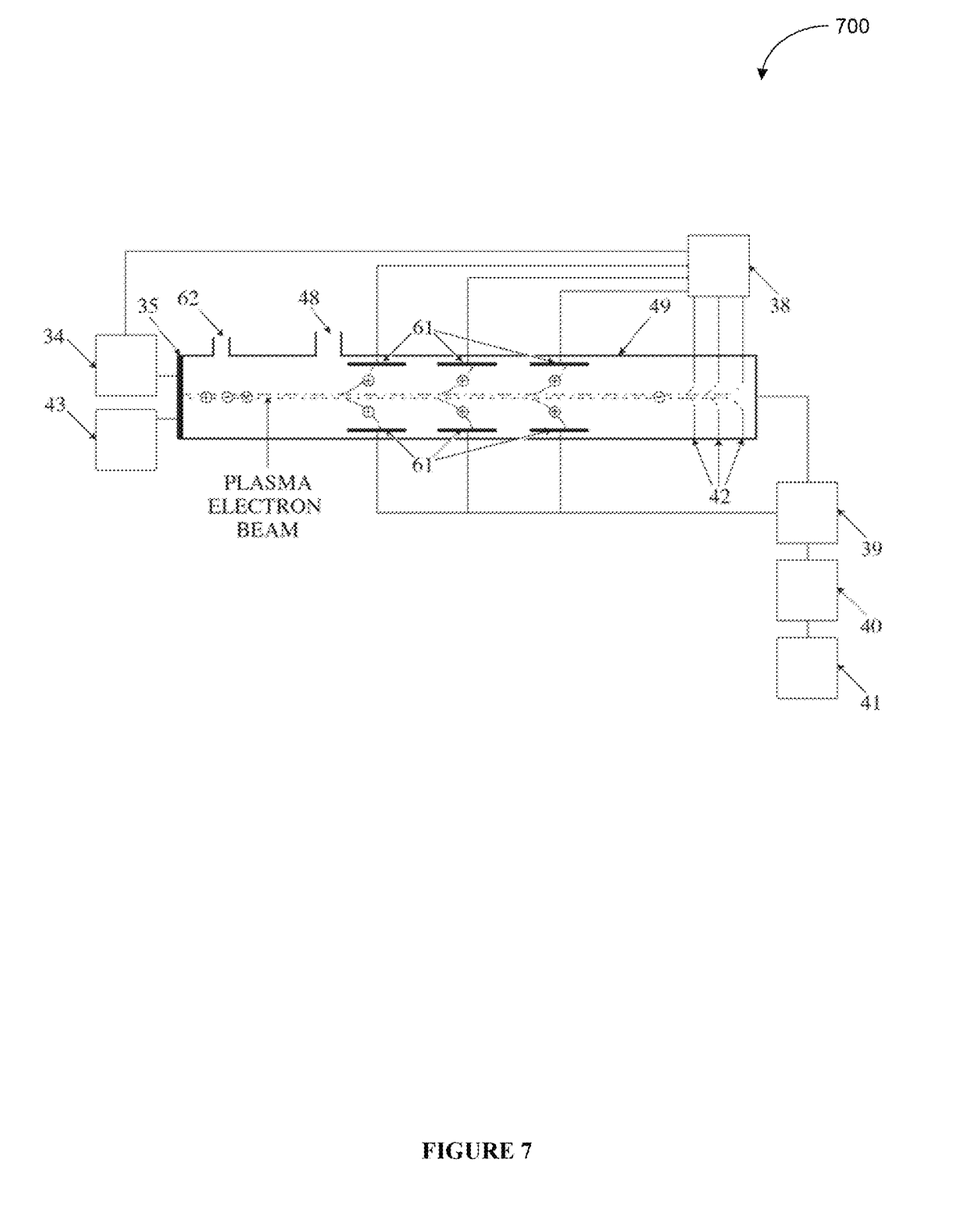
FIG. 7 illustrates a power generator in which the electron beam is a plasma electron beam, according to various embodiments of the invention.

FIG. 7 illustrates a power generator in which the electron beam is a plasma electron beam, according to various embodiments of the invention. Components similar to those shown in FIG. 6 are labeled in the same manner. For purposes of brevity, a description or their function is not repeated here. The plasma electron beam consists of neutral as well as charged species (i.e., ions and electrons). If the plasma electron beam travels at a velocity, v, and a magnetic field is established perpendicular to the beam, with a magnetic field strength, $B_{app}$, the interaction between the two fields induces an electric field, $E_{ind}$, that is at right angles to both v and $B_{app}$ and given by the equation $$E_{ind} = v \times B_{app}$$

It is noted that a sufficiently strong magnetic field renders a conducting gas anisotropic and, thus, the conductivity becomes a tensor quantity rather than a scalar used here for purposes of simplification. Then, per Ohm's law, the density of the current induced in the conductive fluid (i.e., the plasma) becomes $$J_{ind} = \sigma E_{ind}.$$

Simultaneously with the induced current ponder-motive force, $F_{ind}$, is induced and given by the vector product $$F_{ind} = J_{ind} \times B_{app}$$

This force occurs because, as in an electric generator, the conducting fluid cuts the lines of the magnetic field. The equation above yields a vector perpendicular to both $J_{ind}$ and $B_{app}$. The induced force is parallel to v but opposite in direction. In FIG. 7 an electric field, $E_{app}$, is applied at right angles to both $B_{app}$ and v, but opposite in direction to $J_{ind}$. The current density due to this applied electric field is denoted by $J_{cond}$ and called conduction current. The net current density, J, through the conducting fluid is then $$J=\sigma(E_{app}+v\times B_{app})=\sigma(E_{app}+E_{ind}).$$

The ponder-motive or Lorentz force associated with the conduction current is then $$F=J\times B_{app}=\sigma(E_{app}+v\times B_{app})\times B_{app}$$

If $E_{app} > v \times B_{app}$, we obtain an accelerator that can enhance power production as well as electromagnetic wave generation. This approach is superior to conventional means of producing power in that the acceleration of the fluid occurs by electromagnetic fields rather than by using large quantities of thermal energy that limit the amount of power produced and, thus, efficiency and cause thermal deterioration of the turbine generator walls. Unlike conventional magneto-hydrodynamic (MHD) power generation, this embodiment avoids the high temperatures required to generate a gas that is sufficiently ionized to have the desired high conductivity for electromagnetic acceleration.

Additional advantages over MHD reactors include that no difficult to handle and toxic (e.g, mercury or liquid sodium) conducting liquids are used. The flow of liquid metals, such as molten sodium-potassium eutectic solutions, in MHD reactors necessitates unusual pumping, controlling, and measurement techniques. In addition, cooling of the walls of the reaction chamber requires not easily obtained high heat transfer rates. Furthermore, to sufficiently cool the reactor walls that are in constant contact with the hot conductive gas, oftentimes magnets designs are employed that are fairly difficult to implement and prone to causing flow instabilities.

Power generator 700 in FIG. 7 comprises electrodes 61 and collector power supply 38 coupled to both electrodes 61 and collector electrodes 42. Electrodes 61 are arranged as a series of parallel plate pairs that are symmetrically distributed at either side of the plasma electron beam along the top and bottom ends of drift tube 49, i.e., parallel to the direction of motion for the plasma beam. However, this is not intended as a limitation, as electrodes 61 may have any shape and be positioned at other suitable locations within power generator 700. Electrodes 61 may be arranged according to sequentially decreasing negative potential, for example, to allow for different ionized species formed in the electron beam having different velocities due to their different ionic weights to be captured at more than one potential.

In order to provide ions for the plasma beam, port 62 may be used to admit gases that can be ionized in the plasma beam. These include inert gases, hydrogen, and alkali metals.

In example in FIG. 7, electrodes 61 have a higher negative potential than cathode 35 in order to attract positive ions from the plasma beam. The high negative potential of electrodes 61 permits electrons to travel from cathode 35 to the relatively lower negative potential of collector electrodes 42 without being prematurely captured by electrodes 61. Collector electrodes 42 are arranged as a series of multi-electrode collectors whose potential matches the beam potential and have a relatively higher potential than electron emitting cathode 35. This facilitates capture of electrons by electrodes 42 and provides for the recovery of energy from the plasma beam.

Figure 8:
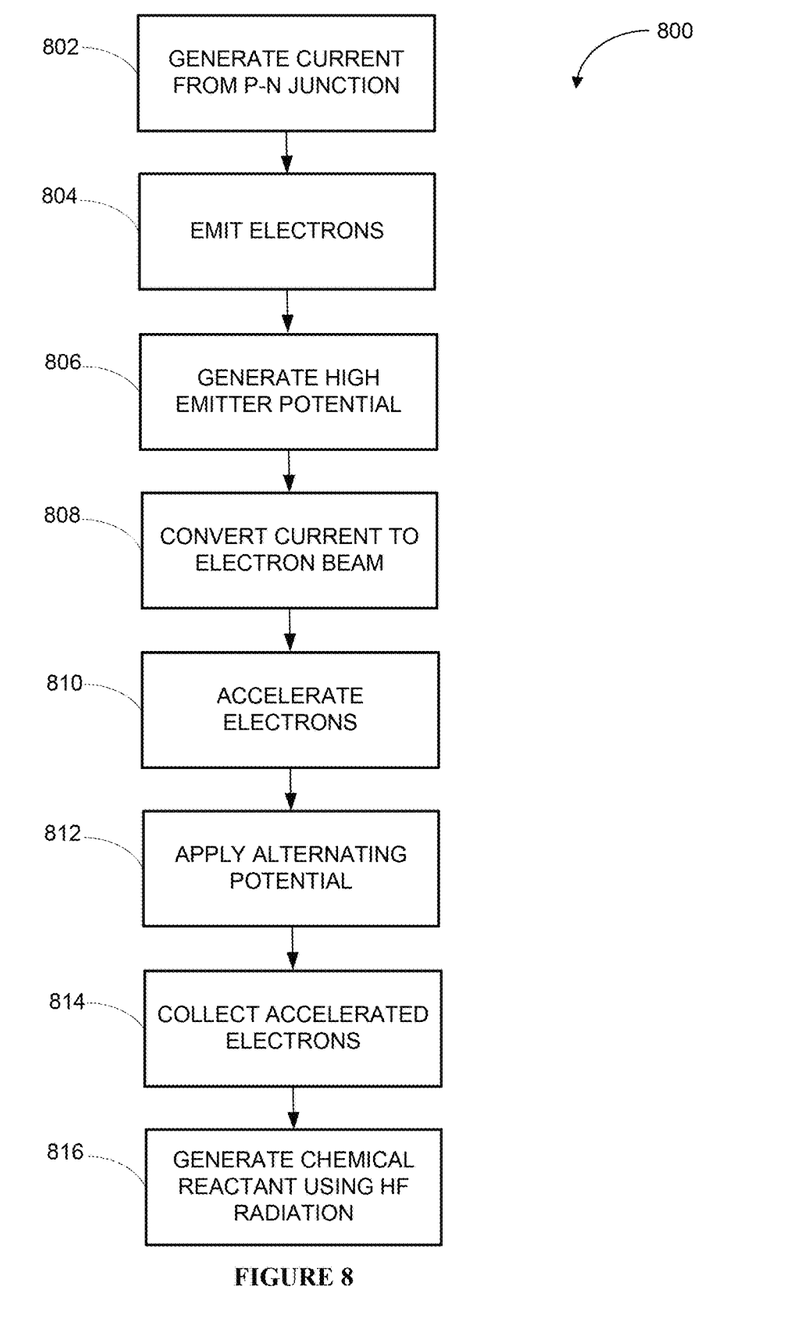
FIG. 8 is a flowchart of an illustrative process for power generation from a renewable energy source in accordance with various embodiments of the invention.

FIG. 8 is a flowchart of an illustrative process for power generation from a renewable energy source in accordance with various embodiments of the invention. At step 802, a current is generated from a p-n junction of a solar cell.

At step 804, a part of the current is applied to an emitter that emits electrons.

At step 806, a high potential is generated on the emitter, for example, by applying a part of the current to the emitter.

At step 808, current is converted into an electron beam that is emitted from the emitter.

At step 810, the emitted electrons are accelerated to a high kinetic energy level.

At step 812, an alternating potential is applied between the emitter and a collector in order to generate an alternating current.

At step 814, the electrons from the accelerated electron beam are collected, for example, to provide a second current at a potential that is lower than the emitter potential in order to drive a load.

Finally, at step 816, chemical reactants are created, for example, by using high frequency radiation created by the electron beam.

It will be appreciated by those skilled in the art that fewer or additional steps may be incorporated with the steps illustrated herein without departing from the scope of the invention. No particular order is implied by the arrangement of blocks within the flowchart or the description herein.

It will be further appreciated that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art, upon a reading of the specification and a study of the drawings, are included within the scope of the present invention. It is therefore intended that the claims include all such modifications, permutations, and equivalents as fall within the true spirit and scope of the present invention.

The invention claimed is:

1. A power generating apparatus to generate energy from a renewable energy source, the power generating apparatus comprising:
   an emitter to convert a first current that has been derived from a solar cell into a coherent electron beam, the emitter having a first single potential;
   a collector having a second potential to accelerate electrons in the coherent electron beam, the collector provides a second current that is capable of driving a load; and
   an electromagnetic radiation device to generate electromagnetic radiation at a frequency substantially equal to an absorption frequency of a predetermined chemical reactant to generate hydrogen from water vapor.

2. The power generating apparatus according to claim 1, wherein the collector comprises at least two collector electrodes, the at least two collector electrodes having different potentials.

3. The power generating apparatus according to claim 1, wherein the emitter is selected from the group consisting of a photoelectric emitter, a thermionic emitter, and a field effect emitter, and emits electrons at a higher density than an emission density of electrons in a p-n junction of a solar cell.

4. The power generating apparatus according to claim 1, further comprising a magnetic field that maintains a cohesive integrity of the electron beam, wherein the electron beam is one of a coherent electron beam and a plasma electron beam.

5. The power generating apparatus according to claim 1, further comprising a grid to generate an alternating voltage that generates an alternating magnetic field that modulates the accelerated electron beam.

6. The power generating apparatus according to claim 1, wherein the solar cell has an electric field in a depletion layer of a p-n junction, the electric field is transmitted to an inner-electrode space of the apparatus, the inner-electrode space being greater than the depletion layer.

7. A power generation system to generate energy from a renewable energy source, the system comprising: an apparatus that generates a first current from a solar cell; an emitter to convert the first current into a coherent electron beam, the emitter having a first single potential; and a collector having a second potential to accelerate electrons in the coherent electron beam, the collector providing a second current; a converter that converts the second current to a power source capable of driving a load; and an electromagnetic radiation device that generates electromagnetic radiation at a frequency substantially equal to an absorption frequency of a predetermined chemical reactant to generate hydrogen from water vapor.

8. The power generating apparatus according to claim 1, wherein the electromagnetic radiation device is one of one of a resonant cavity, a slow wave structure, and longitudinal magnetic field structure.

\* \* \* \* \*